(12) United States Patent
Maeda et al.

(10) Patent No.: US 11,640,797 B2
(45) Date of Patent: May 2, 2023

(54) DISPLAY DRIVER IC FOR LOW VOLTAGE SIGNAL CONVERSION AND ELECTRONIC DEVICE COMPRISING THE SAME

(71) Applicant: Samsung Electronics Co., Ltd., Suwon-si (KR)

(72) Inventors: Shigenobu Maeda, Seongnam-si (KR); Dong-Il Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 17/215,230

(22) Filed: Mar. 29, 2021

(65) Prior Publication Data

US 2021/0327366 A1 Oct. 21, 2021

(30) Foreign Application Priority Data

Apr. 17, 2020 (KR) .......................... 10-2020-0046758

(51) Int. Cl.
*G09G 3/30* (2006.01)
*G09G 3/3291* (2016.01)
*G09G 3/3233* (2016.01)
*G09G 3/29* (2006.01)
*H03K 19/0185* (2006.01)

(52) U.S. Cl.
CPC .............. *G09G 3/3291* (2013.01); *G09G 3/29* (2013.01); *G09G 3/3233* (2013.01); *G09G 2300/0819* (2013.01); *G09G 2300/0842* (2013.01); *G09G 2300/0861* (2013.01); *G09G 2310/027* (2013.01); *G09G 2310/0286* (2013.01); *G09G 2310/0289* (2013.01); *G09G 2310/0291* (2013.01); *H03K 19/018521* (2013.01)

(58) Field of Classification Search
CPC ...... G09G 3/3291; G09G 3/3233; G09G 3/29; G09G 2300/0819; G09G 2300/0842; G09G 2300/0861; G09G 2310/027; G09G 2310/0286; G09G 2310/0289; G09G 2310/0291; H03K 19/018521
See application file for complete search history.

(56) References Cited

U.S. PATENT DOCUMENTS

| 6,744,415 B2 | 6/2004 | Waterman et al. |
| 7,280,115 B2 | 10/2007 | Wang et al. |
| 8,941,520 B2 | 1/2015 | Kim et al. |

(Continued)

FOREIGN PATENT DOCUMENTS

| JP | 2004219647 A | * | 4/2004 |
| KR | 20100078194 A | | 7/2010 |

*Primary Examiner* — Adam J Snyder
(74) *Attorney, Agent, or Firm* — Harness, Dickey & Pierce, P.L.C.

(57) ABSTRACT

A display driver integrated circuit (IC) is provided. The display driver IC includes a shift register configured to output a digital signal, and a digital-analog converter configured to receive the digital signal and generate a data voltage corresponding to the digital signal, wherein the digital-analog converter includes a delta-sigma modulator configured to output a modulated signal by receiving the digital signal and a first voltage, and performing delta-sigma modulation on the digital signal using the first voltage, and a level shifter configured to receive the modulated signal and a second voltage higher than the first voltage, and amplify the modulated signal using the second voltage.

20 Claims, 15 Drawing Sheets

(56) References Cited

U.S. PATENT DOCUMENTS

| | | | |
|---|---|---|---|
| 9,628,102 B2 | 4/2017 | Tu et al. | |
| 2006/0244743 A1 | 11/2006 | Tanaka et al. | |
| 2007/0126618 A1 | 6/2007 | Tanaka et al. | |
| 2010/0164775 A1* | 7/2010 | Kim | H03M 1/68 |
| | | | 341/143 |
| 2010/0164776 A1* | 7/2010 | Yi | H03M 3/502 |
| | | | 341/143 |
| 2010/0164933 A1* | 7/2010 | Lim | G09G 3/3688 |
| | | | 341/144 |
| 2011/0001692 A1 | 1/2011 | Tu | |
| 2011/0248982 A1* | 10/2011 | Chuang | G09G 3/3685 |
| | | | 345/212 |
| 2019/0130824 A1 | 5/2019 | Tzeng et al. | |

* cited by examiner

10

DISPLAY DRIVER IC FOR LOW VOLTAGE SIGNAL CONVERSION AND ELECTRONIC DEVICE COMPRISING THE SAME

This application claims priority from Korean Patent Application No. 10-2020-0046758 filed on Apr. 17, 2020 in the Korean Intellectual Property Office, the disclosure of which is incorporated herein by reference in its entirety.

BACKGROUND

1. Technical Field

The present inventive concepts relate to a display driver integrated circuit (IC), and a display device and an electronic device including the display driver IC.

2. Description of the Related Art

As display devices used in electronic devices which display images, such as a TV, a laptop computer, a monitor and/or a mobile device, there are a liquid crystal display device (LCD), an organic light emitting display device (OLED) and the like. The display device may include a display panel having a plurality of pixels, and a display drive integrated circuit (DDI) for applying an electric signal to the plurality of pixels, and an image may be realized by the electric signal provided to the plurality of pixels by the display. Mobile DDI (MDDI) is desired to be lighter/smaller in applications to mobile phones and the like.

SUMMARY

Example embodiments of the inventive concepts provide a display driver integrated circuit (IC) capable of miniaturizing a product.

Example embodiments of the inventive concepts also provide a display device including a miniaturized display driver IC.

Example embodiments of the inventive concepts also provide an electronic device including a miniaturized display driver IC.

According to some example embodiments of the present inventive concepts, there is provided a display driver integrated circuit (IC) including a shift register configured to output a digital signal, and a digital-analog converter configured to receive the digital signal and generate a data voltage corresponding to the digital signal, wherein the digital-analog converter includes a delta-sigma modulator configured to output a modulated signal by, receiving the digital signal and a first voltage, and performing delta-sigma modulation on the digital signal using the first voltage, and a level shifter configured to receive the modulated signal and a second voltage higher than the first voltage, and amplify the modulated signal using the second voltage.

According to some example embodiments of the present inventive concepts, there is provided a display device including a display panel including pixels, and a display driver integrated circuit (IC) configured to generate a data voltage to cause the pixels to display a gray scale by, receiving digital image data, performing delta-sigma modulation on the digital image data using a first voltage, and amplifying the modulated signal using a second voltage higher than the first voltage to generate the data voltage, and provide the data voltage to the display panel.

According to some example embodiments of the present inventive concepts, there is provided an electronic device including a host configured to output digital image data, a display panel including pixels, and a display driver integrated circuit (IC) configured to generate a data voltage to cause the pixels to display a gray scale corresponding to the digital image data by, performing delta-sigma modulation on the digital image data using a first voltage, and amplifying the modulated signal using a second voltage higher than the first voltage. However, example embodiments of the present inventive concepts are not restricted to the ones set forth herein. The above and other example embodiments of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other example embodiments and features of the present inventive concepts will become more apparent by describing in detail example embodiments thereof with reference to the attached drawings, in which:

FIG. 16 is a diagram for explaining the effect of the display driver IC according to some example embodiments; and.

DETAILED DESCRIPTION

Hereinafter, some example embodiments according to the present inventive concepts will be described with reference to the accompanying drawings.

Figure 1:
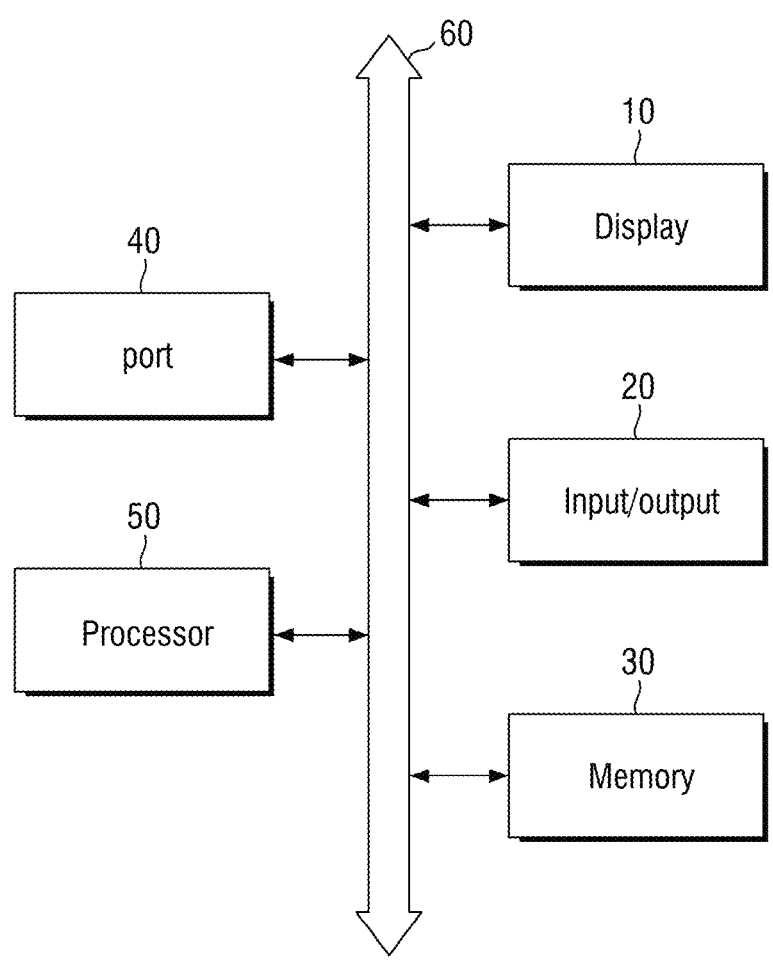
FIG. 1 is a block diagram of an electronic device including a display device according to some example embodiments.
Figure 2:
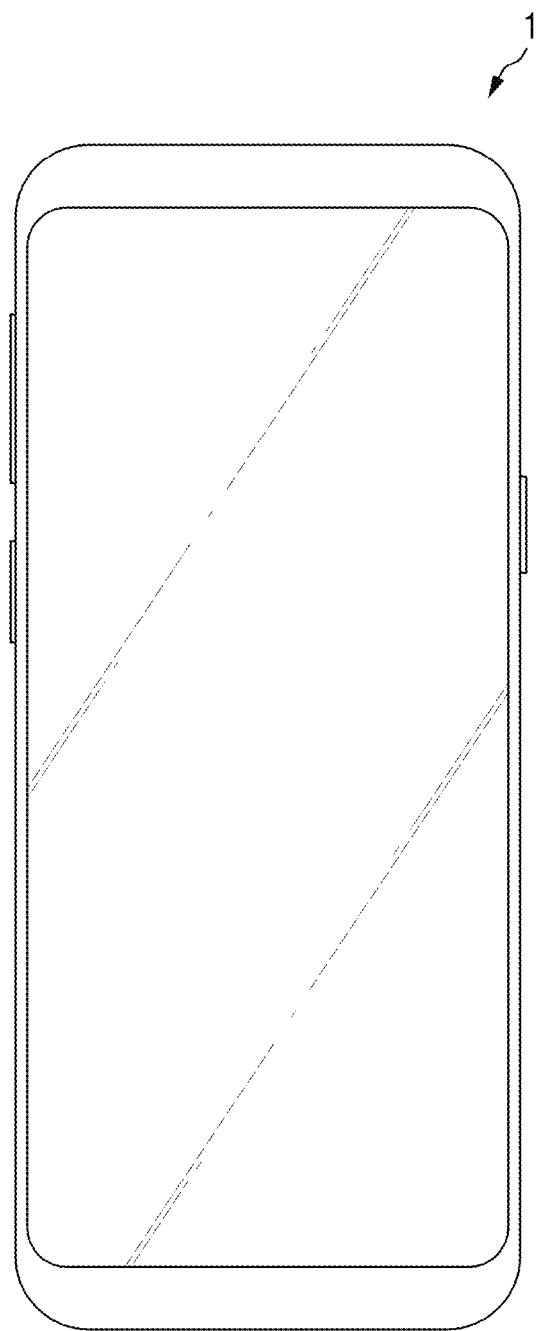
FIG. 2 is a diagram showing an electronic device equipped with a display device according to some example embodiments.

FIG. 1 is a block diagram of an electronic device including a display device according to some example embodiments. FIG. 2 is a diagram showing an electronic device equipped with a display device according to some example embodiments.

Referring to FIGS. 1 and 2, an electronic device 1 may include a display device 10, an input/output unit 20, a memory 30, a port 40, a processor 50, and the like.

The electronic device 1 may be, for example, a smart phone as shown in FIG. 2. For example, although a smartphone is shown as an example of the electronic device 1 in FIG. 2, in addition to mobile devices such as a tablet PC and a laptop computer, a television, a desktop computer and the like may also be an example of the electronic device 1 according to the present inventive concepts.

The display device 10, the input/output unit 20, the memory 30, the port 40, the processor 50 and the like may communicate with each other via a bus 60.

The display device 10 may include, for example, a display driver integrated circuit (IC) and a display panel. In some example embodiments, the display driver IC may display image data, which is transmitted by the processor 50 (e.g., AP (Application Processor)) through the bus 60, on the display panel, depending on an operation type. The display driver IC may generate the number of data voltages corresponding to the number of bits of the image data transmitted by the processor 50.

Instead of a processor, the functions of processor 50 may be implemented using any processing circuitry such as a hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 3:
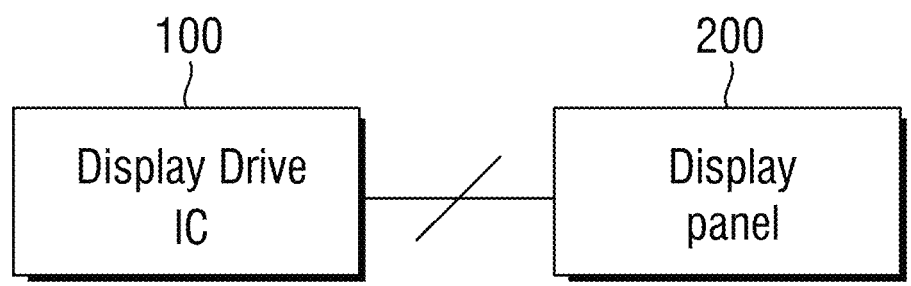
FIGS. 3 to 5 are diagrams for explaining a display device including a display driver integrated circuit (IC) according to some example embodiments.
Figure 4:
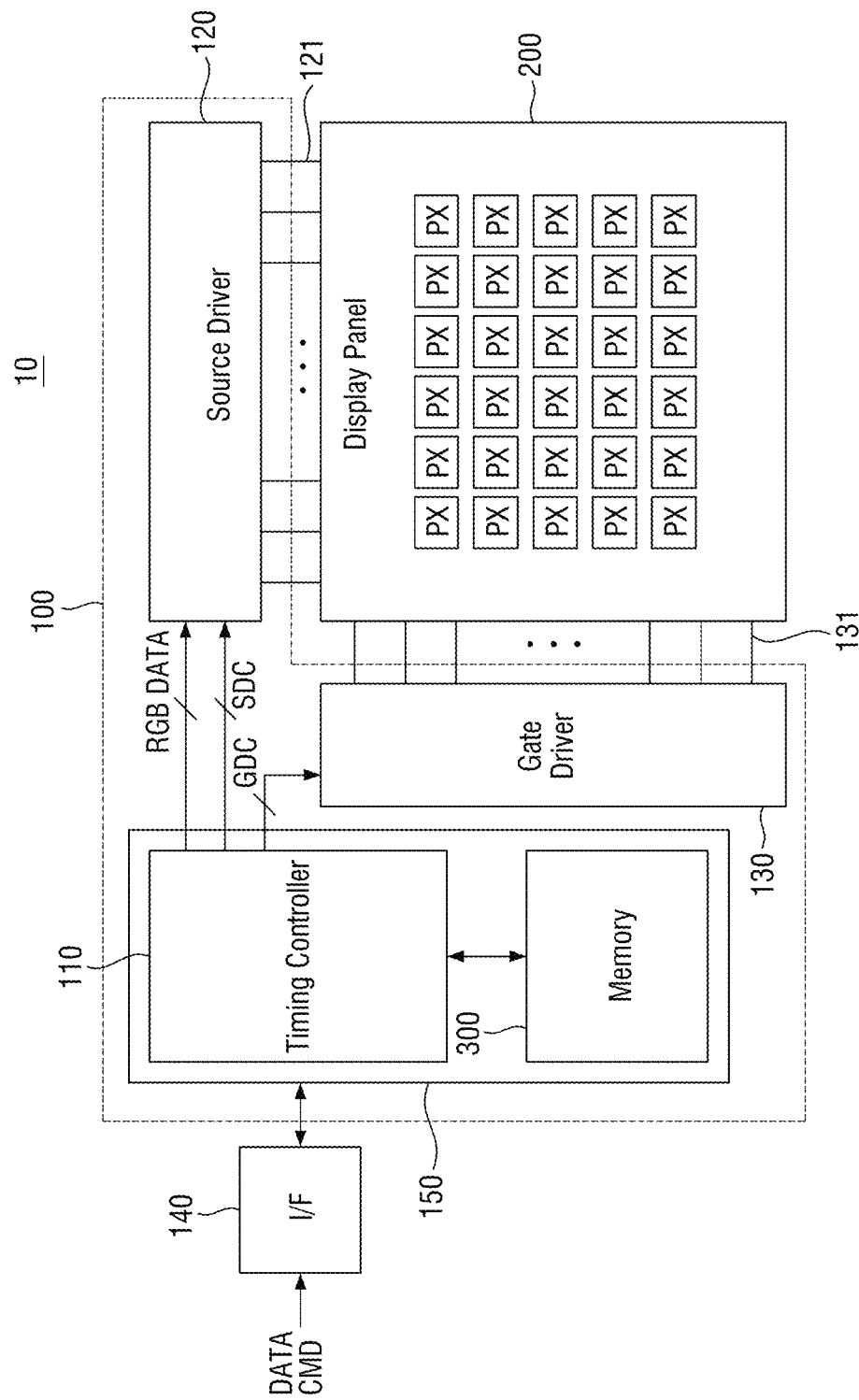
Figure 5:
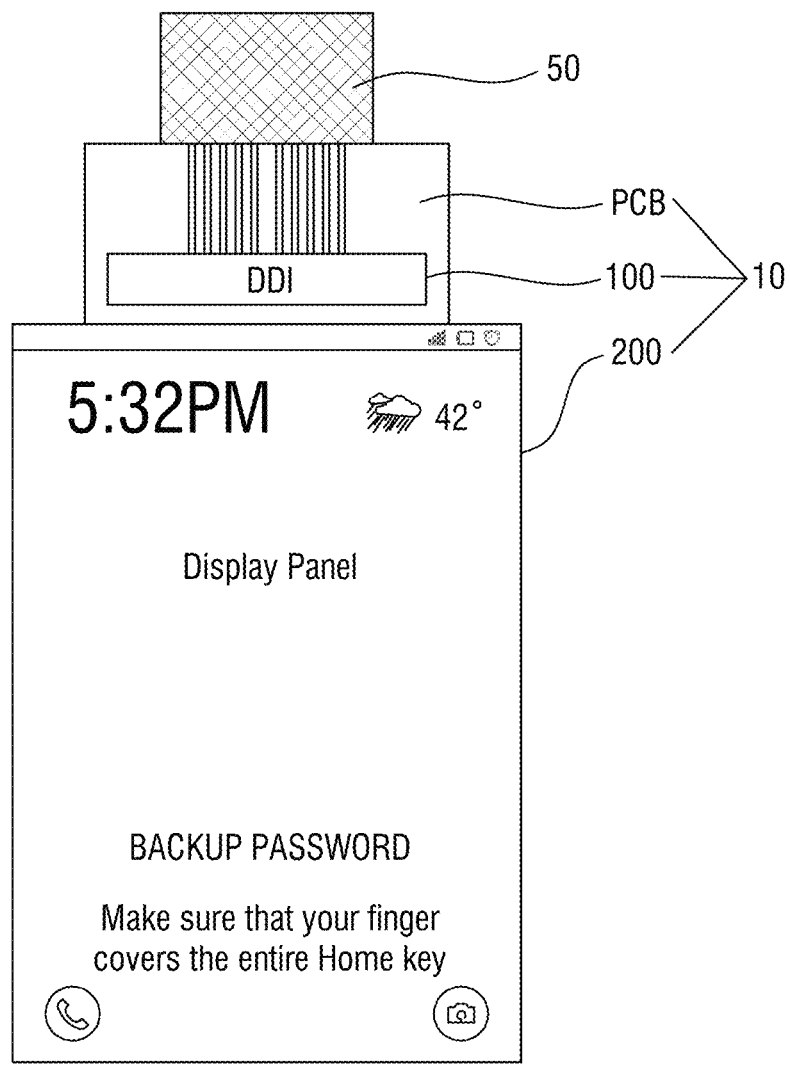

FIGS. 3 to 5 are diagrams for explaining a display device including a display driver IC according to some example embodiments.

Referring to FIGS. 3 to 5, the display device 10 according to some example embodiments may include a display driver IC 100 (DDI) and a display panel 200.

Referring to FIG. 3, the display driver IC 100 may control the display panel 200.

Although the display device 10 may be, for example, an organic light emitting diode display (OLED), a liquid crystal display (LCD), a plasma display panel (DP) device, an electrochromic display (ECD), a digital mirror device (DMD), an actuated mirror device (AMD), a grating light value (GLV), a plasma display panel (PDP), and an electro luminescent display (ELD), the examples are not limited thereto.

Referring to FIG. 4, the display driver IC 100 may include a display drive controller 150, a source driver 120 and/or a gate driver 130.

The display drive controller 150 receives application of data DATA and a command CMD from the outside, for example, a host (e.g., the processor 50 of FIG. 1) of a system on which the display device 10 is mounted, and may provide image data RGB DATA, a source control signal SDC and a gate control signal GDC for the operation to the source driver 120 and the gate driver 130. In some example embodiments, although the image data RGB DATA may be a digital signal, the embodiments are not limited thereto.

The memory 300 may be, for example, a frame memory. Meanwhile, the display drive controller 150 may further include an image processing unit, a memory controller, a command free buffer, a command register, a command sync controller, and the like.

The display panel 200 may include a plurality of gate lines 131 for transferring a scan signal in a row direction, a plurality of source lines 121 disposed in a direction intersecting the gate lines 131 and transferring a data signal in a column direction, and a plurality of pixels PX arranged in a region in which the gate lines 131 intersect the source lines 121.

If the plurality of gate lines 131 is sequentially selected, the data voltage may be applied to the pixels PX connected to the selected gate lines 131 through the plurality of source lines 121.

Each or one or more pixel PX may include a switching transistor, a driving transistor, a storage capacitor and/or a light emitting element. The gate lines 131 and the source lines 121 may be connected to the pixel PX.

The source driver 120 converts image data RGB DATA, which is digital data applied from the display drive controller 150, into a data voltage, and may apply the data voltage to the display panel 200 through the source lines 121. The gate driver 130 may scan the gate lines 131 in order. The gate driver 130 applies a gate-on voltage to the selected gate line 131 to activate the selected gate line 131, and the source driver 120 may output the data voltage corresponding to the image data RGB DATA to the pixels PX connected to the activated gate lines 131. Accordingly, the display panel 200 may display an image in units of horizontal lines, that is, row by row.

The display device 10 may communicate with a host (e.g., the processor 50 of FIG. 1) through the interface circuit 140. The interface circuit 140 may receive the data DATA and the command CMD applied in parallel or in serial from the host and provide them to the display drive controller 150. The data DATA and the command CMD may be transmitted from the host (e.g., the processor 50 of FIG. 1) of the system on which the display device 10 is mounted. The interface circuit 140 may receive data DATA and command CMD depending on the interface type corresponding to the transmission type of the host. For example, the interface type used in the interface circuit 140 may be one of RGB interface, CPU interface, PSI (Service provider interface), MDDI (Mobile display digital interface) and MIPI (Mobile industry processor interface) types.

The display drive controller 150 may include a timing controller 110 and a memory 300.

The timing controller 110 may generate a source control signal SDC for controlling the operation timing of the source driver 120, and a gate control signal GDC for controlling the operation timing of the gate driver 130, on the basis of the signals such as data DATA and command CMD.

The memory 300 temporarily stores the image data RGB DATA of one frame to be displayed on the display panel 200, and then, memory 300 may output the image data RGB DATA so as to be displayed on the display panel 200. The memory 300 is also called a graphic RAM (GRAM), and a volatile memory such as a SRAM (static random access memory) may be used. However, embodiments according to the present inventive concepts are not limited thereto, and various kinds of memories may be used.

The display drive controller 150 may control the overall operation of the memory 300, and in particular, it may control the address and timing at which a write operation and a read operation are performed in the memory 300.

Referring to FIG. 5, the display device 10 may include a display panel 200, a display driver IC 100, and a PCB substrate (Printed Circuit Board Substrate: PCB). The display panel 200, the display driver IC 100, and the processor 50 may be connected to each other by the PCB substrate PCB.

In some example embodiments the PCB substrate PCB may include a flexible PCB substrate. The flexible PCB substrate may be folded, and the display driver IC 100 and the processor 50 may be mounted on the flexible PCB substrate. In some example embodiments, the display driver IC 100 and the processor 50 may be located on a back side of the display panel 200 in a state in which the flexible PCB substrate is folded.

Figure 6:
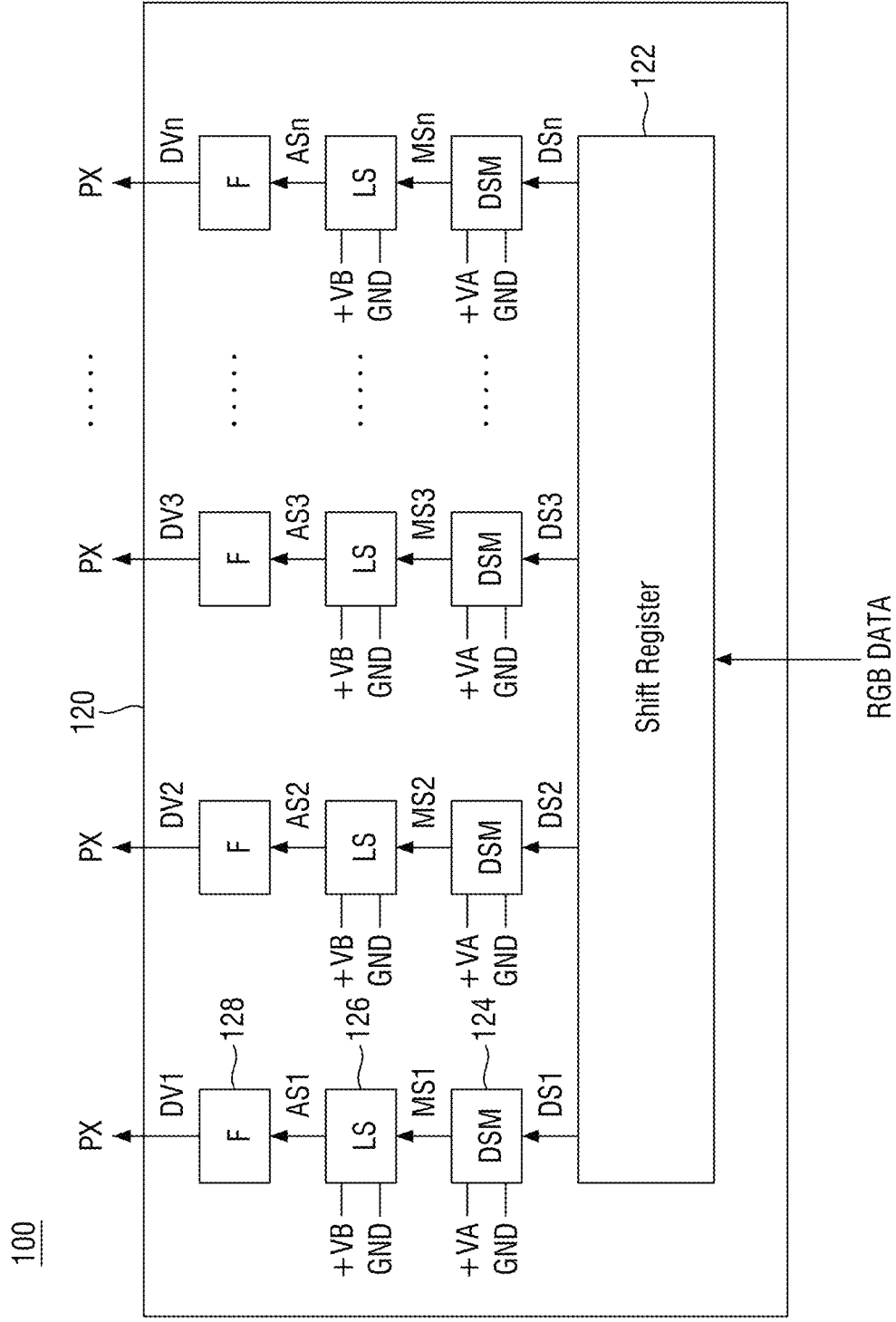
FIG. 6 is a block diagram of the display driver IC according to some example embodiments.

FIG. 6 is a block diagram of a display driver IC according to some example embodiments. FIG. 6 is a diagram mainly showing the source driver 120 of the display driver IC 100.

Referring to FIG. 6, the source driver 120 of the display driver IC 100 may include a shift register 122 and a digital-analog converter. For example, although other components are not shown in detail in FIG. 6 for convenience of explanation, the embodiments are not limited to the shown configurations.

The shift register 122 may receive provision of image data RGB DATA. In some example embodiments, the image data RGB DATA provided from the host (e.g., processor 50 of FIG. 1) may be a digital signal. The shift register 122 receives provision of digital image data RGB DATA, and may generate and output digital signals DS1 to DSn (here, n is a natural number) in units of a predefined (or alternately given) number of bits.

That is, the shift register 122 may output the received digital image data RGB DATA in the form of digital signals DS1 to DSn in units of p (here, p is a natural number) bits. Accordingly, each or one or more of the digital signals DS1 to DSn may be signals including p bits.

Here, the p value may change depending on the number of gray scales that may be indicated by the unit pixel (PX of FIG. 4). For example, if the number of gray scales that may be indicated by the unit pixel (PX of FIG. 4) is large, the p value is also large, and if the number of gray scales that may be indicated by the unit pixel (PX of FIG. 4) is small, the p value may also be small.

The digital-analog converter may receive provision of the digital signals DS1 to DSn and output data voltages DV1 to DVn corresponding thereto. The data voltages DV1 to DVn may be analog signals provided to each or one or more unit pixel (PX of FIG. 4) so that each or one or more unit pixel (PX of FIG. 4) may indicate the gray scale corresponding to the digital signals DS1 to DSn.

In some example embodiments, the digital-analog converter may include a delta-sigma modulator 124, a level shifter 126 and/or a filter 128. Although only the delta-sigma modulator 124, the level shifter 126, and the filter 128 are shown in the drawing as components of the digital-analog converter that generates the data voltages DV1 to DVn corresponding to each or one or more of the digital signals DS1 to DSn, the embodiments are not limited thereto. The digital-analog converter may further include configurations that are not shown.

The delta-sigma modulator 124 may receive provision of the digital signals DS1 to DSn and a first voltage VA. Further, the delta-sigma modulator 124 performs delta-sigma modulation on the digital signals DS1 to DSn using the first voltage VA to output the modulated signals MS1 to MSn.

Although a configuration in which the first voltage VA and the ground voltage GND are provided to the delta-sigma modulator 124 is shown in the drawing, the embodiments are not limited thereto. In some other example embodiments, the embodiment may be provided in a modified manner such that a third voltage rather than the first voltage VA and the ground voltage GND is provided to the delta-sigma modulator 124.

The first voltage VA provided to the delta-sigma modulator 124 may be, for example, a low voltage. That is to say, the delta-sigma modulator 124 may be a low-voltage element that performs delta-sigma modulation at a low voltage. In some example embodiments, the first voltage VA may be a voltage provided from the outside of the display driver IC 100. In some example embodiments, although the first voltage VA may be, for example, 1V, the embodiments are not limited thereto.

Further, although it is not shown in detail in the drawings, the shift register 122 may also be a low-voltage element that operates by receiving the first voltage VA.

The level shifter 126 may receive provision of modulated signals MS1 to MSn and a second voltage VB higher than the above-mentioned first voltage VA. Further, the level shifter 126 may amplify the modulated signals MS1 to MSn using the second voltage VB to output amplified signals AS1 to ASn.

Although the configuration in which the second voltage VB and the ground voltage GND are provided to the level shifter 126 is shown in the drawing, the embodiments are not limited thereto. In some other example embodiments, the modified example embodiment may be provided such that a fourth voltage rather than the second voltage VB and the ground voltage GND is provided to the level shifter 126.

The second voltage VB provided to the level shifter 126 may be, for example, a high voltage. That is to say, the level shifter 126 may be a high-voltage element that amplifies a signal at a high voltage.

In some example embodiments, the second voltage VB may be a voltage provided from the outside of the display driver IC 100. That is, the first voltage VA and the second voltage VB are provided from the outside of the display driver IC 100, the first voltage VA may be used to drive the delta-sigma modulator 124, and the second voltage VB may be used to drive the level shifter 126. In some example embodiments, although the second voltage VB may be, for example, 8V, the embodiments are not limited thereto.

Figure 7:
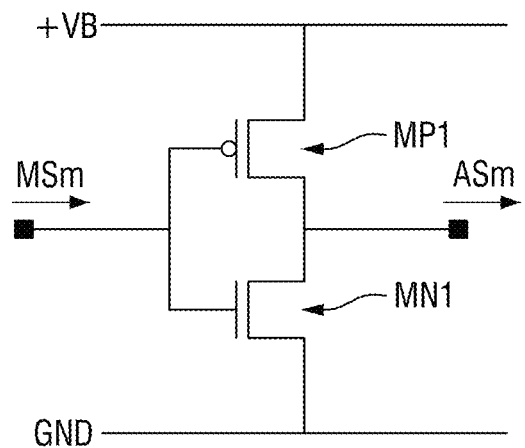
FIG. 7 is an example circuit diagram of a level shifter shown in FIG. 6.

FIG. 7 is an example circuit diagram of the level shifter shown in FIG. 6.

In some example embodiments, the level shifter 126 may include, for example, a D-Class amplifier.

Referring to FIG. 7, the level shifter 126 may include a first transistor MP1 and a second transistor MN1.

A modulated signal MSm (here, m is a natural number between 1 and n) is provided to a gate end of the first transistor MP1, and the second voltage VB may be provided to a source end. A drain end of the first transistor MP1 may be connected to the source end of the second transistor MN1.

The modulated signal MSm may also be provided to the gate end of the second transistor MN1. The ground voltage GND may be provided to the source end of the second transistor MN1. The modulated signal MSm that is input to the gate ends of the first transistor MP1 and the second transistor MN1 is amplified using the second voltage VB and may be output as an amplified signal ASm.

Here, although it is shown that the ground voltage GND is provided to the source end of the second transistor MN1, the embodiments are not limited thereto, and the modified example embodiment may be provided such that a fourth voltage rather than the ground voltage GND is provided to the source end of the second transistor MN1.

Referring to FIG. 6 again, the filter 128 may receive and store the amplified signals AS1 to ASn from the level shifter 126 to generate the data voltages DV1 to DVn. In some example embodiments, although the filter 128 may be, for example, a low pass filter, the embodiments are not limited thereto. Further, in some example embodiments, although the filter 128 may be, for example, an RC filter including a resistor and a capacitor, the embodiments are not limited thereto.

Figure 8:
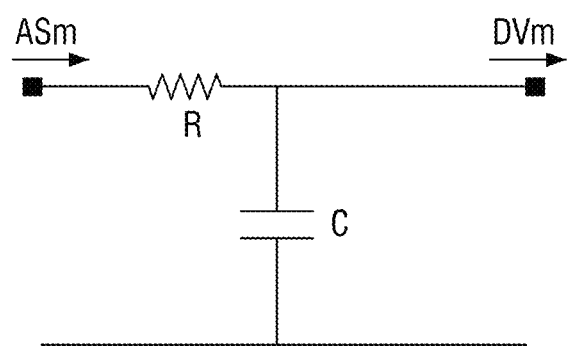
FIG. 8 is an example circuit diagram of a filter shown in FIG. 6.

FIG. 8 is an example circuit diagram of the filter shown in FIG. 6.

Referring to FIG. 8, the filter 128 may include a resistor R and a capacitor C. The capacitor C included in the filter 128 may store the applied amplified signal ASm and generate a data voltage DVm. Specifically, the amplified signal ASm may be accumulated in the capacitor C included in the filter 128 to generate a stable data voltage DVm corresponding to the digital signal DSm.

Referring to FIG. 6 again, the data voltages DV1 to DVn output from the filter 128 may be provided to each or one or more pixel PX of the display panel (200 of FIG. 4). Each or one or more pixel PX provided with the data voltages DV1 to DVn may display a gray scale corresponding to the digital signals DS1 to DSn, using the data voltages DV1 to DVn.

Figure 9:
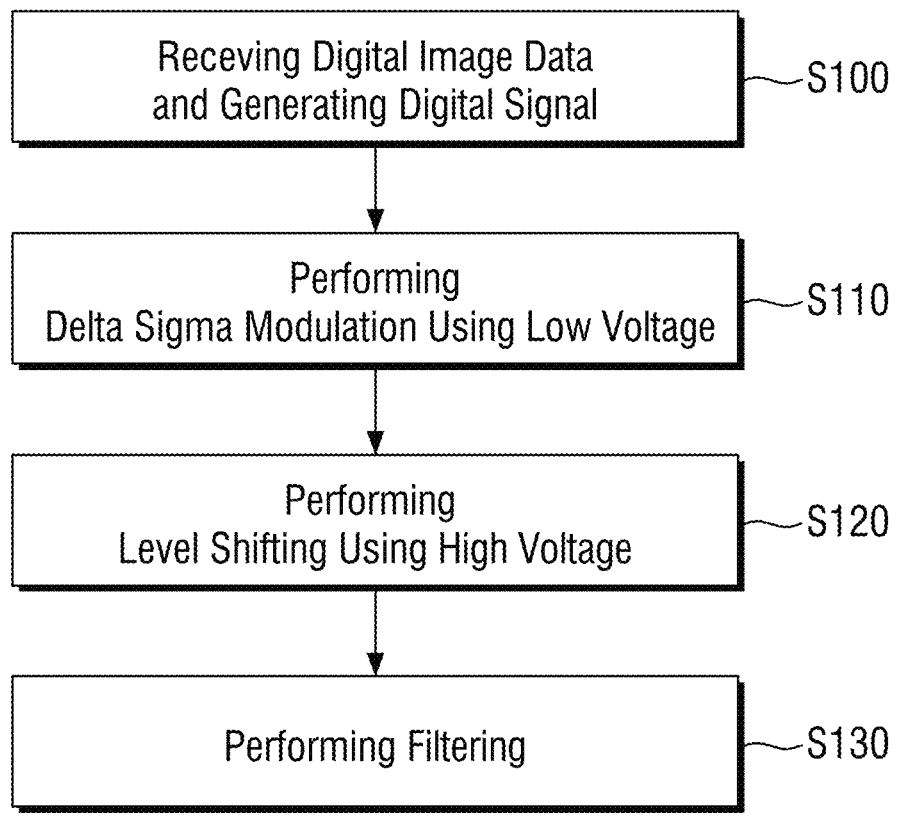
FIG. 9 is a flowchart of a method of generating a data voltage according to some example embodiments.

FIG. 9 is a flowchart of a method of generating a data voltage according to some example embodiments.

Referring to FIG. 9, digital image data is received and a digital signal is generated (S100).

For example, referring to FIG. 6, the shift register 122 may receive provision of the digital image data RGB DATA from a host (e.g., the processor 50 of FIG. 1). Further, the shift register 122 may generate digital signals DS1 to DSn each or one or more having p bits from the provided digital image data RGB DATA.

Referring to FIG. 9 again, the delta-sigma modulation is performed using the low voltage (S110).

For example, referring to FIG. 6, the delta-sigma modulator 124 may perform a delta-sigma modulation on the digital signal DS1 to DSn using the first voltage VA to generate modulated signals MS1 to MSn.

Referring to FIG. 9 again, the level shifting is performed using the high voltage (S120).

For example, referring to FIG. 6, the level shifter 126 may amplify the modulated signals MS1 to MSn using the second voltage VB to generate amplified signals AS1 to ASn.

Referring to FIG. 9 again, filtering is performed (S130).

For example, referring to FIG. 6, the filter 128 may store the amplified signals AS1 to ASn and generate the data voltages DV1 to DVn.

Figure 10:
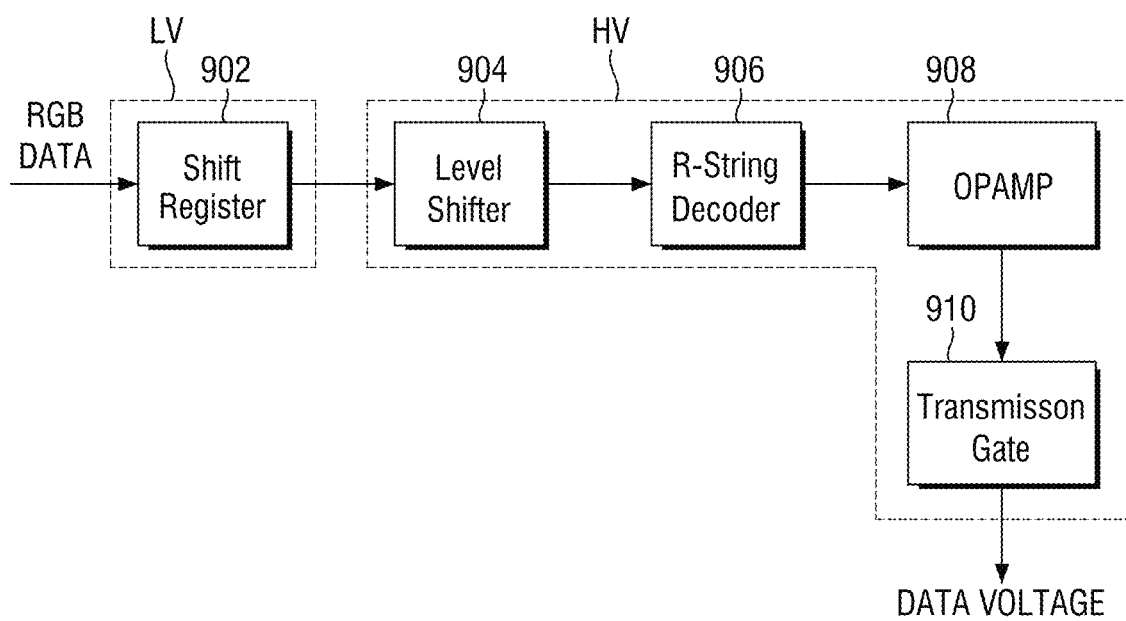
FIGS. 10 and 11 are diagrams for explaining an effect of the display driver IC according to some example embodiments.
Figure 11:
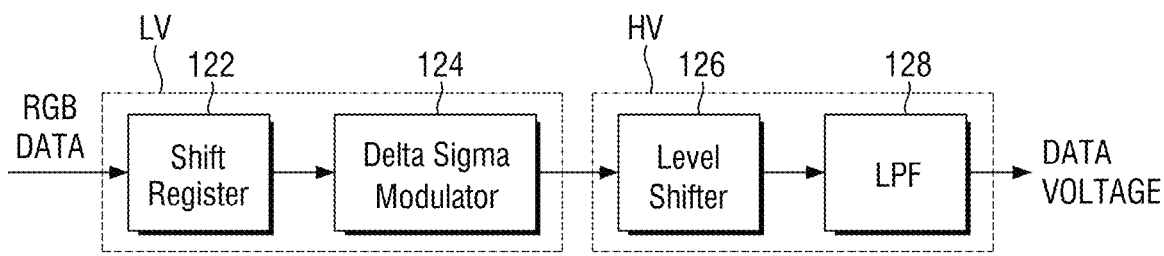

FIGS. 10 and 11 are diagrams for explaining the effect of the display driver IC according to some example embodiments.

FIG. 10 is a diagram showing a configuration of a display driver IC 900 having a configuration different from that of the example embodiments described above according to the present incentive concepts, and FIG. 11 is a diagram showing a configuration of the display driver IC 100 having the configuration of the example embodiments described above according to the present inventive concepts.

Referring to FIG. 10, the display driver IC 900 may include a shift register 902, a level shifter 904, an R-string decoder 906, an OP amplifier 908, and/or a transmission gate 910 to generate a data voltage DATA VOLTAGE from digital image data RGB DATA.

Here, the level shifter 904, the R-string decoder 906, the OP amplifier 908, and the transmission gate 910 are high-voltage elements HV that operate using a high voltage, and the shift register 902 is a low-voltage element LV that operates using a low voltage.

The high-voltage elements HV such as the level shifter 904, the R-string decoder 906, the OP amplifier 908, and/or the transmission gate 910 occupies a large area in the display driver IC 900, compared to the low-voltage elements LV. Therefore, when a large number of high-voltage elements HV are used to generate the data voltage DATA VOLTAGE from the digital image data RGB DATA, the size of the display driver IC 900 increases.

In comparison, in the display driver IC 100 according to the present inventive concepts shown in FIG. 11, the number of high-voltage elements HV used to generate the data voltage DATA VOLTAGE from the digital image data RGB DATA is much less than that of the display driver IC 900. As mentioned above, the shift register 122 and the delta-sigma modulator 124 are used as the low-voltage elements LV, and the level shifter 126 and the filter 128 are used as the high-voltage elements HV. Therefore, the display driver IC 100 can be provided in a much smaller size than the display driver IC 900.

Figure 12:
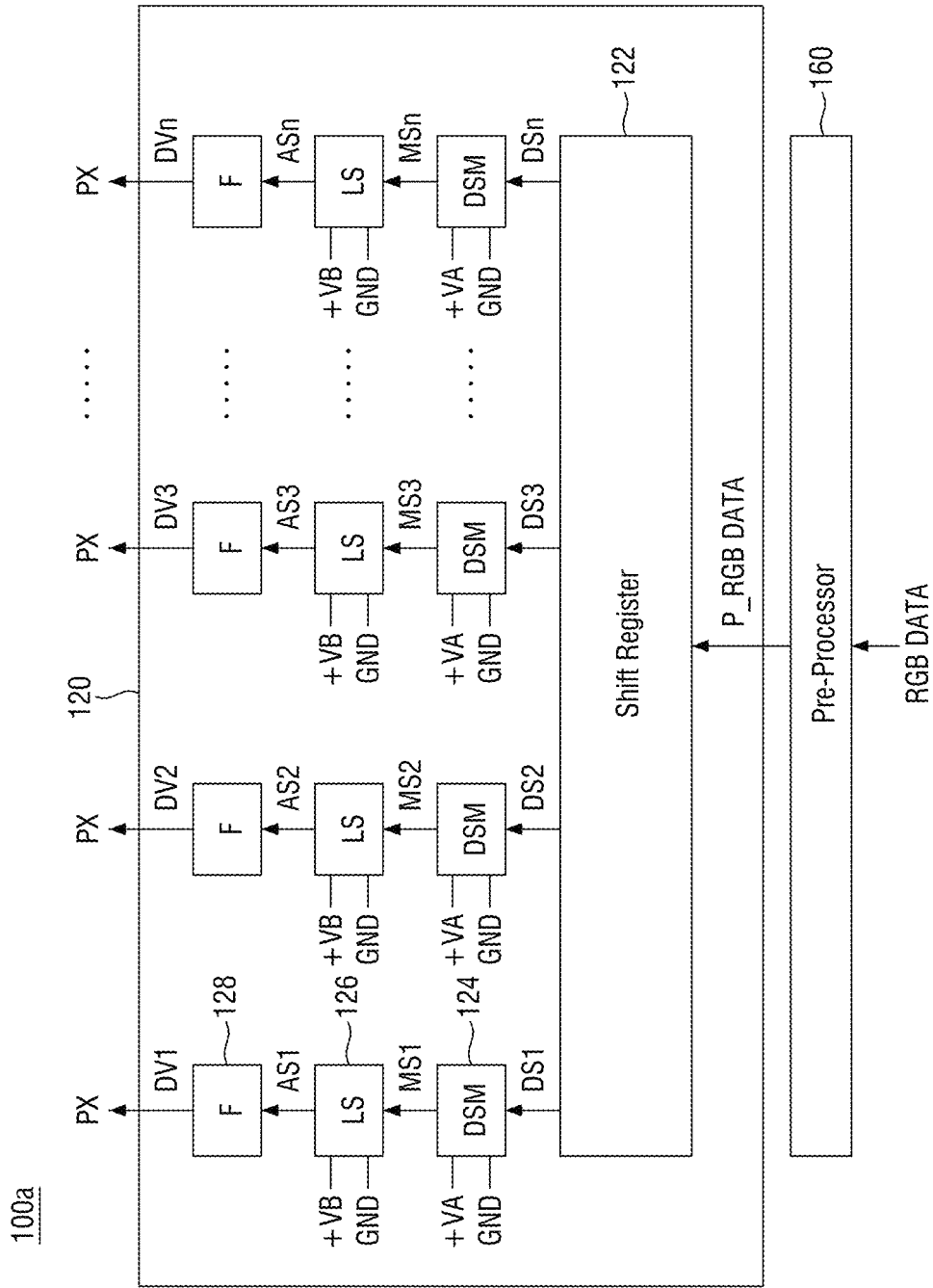
FIG. 12 is a block diagram of the display driver IC according to some example embodiments.

FIG. 12 is a block diagram of a display driver IC according to some example embodiments.

Hereinafter, repeated contents of the above-described example embodiments will not be explained, and the differences will be mainly explained.

Referring to FIG. 12, a display driver IC 100a may further include a pre-processing device 160. In some example embodiments, although such pre-processing device 160 may be located outside the source driver 120, the embodiments are not limited thereto.

The pre-processing device 160 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The pre-processing device 160 may perform pre-processing on the image data RGB DATA for the delta-sigma modulation to be performed by the delta-sigma modulator 124. In some example embodiments, the pre-processing device 160 may perform digital gamma processing on the digital image data RGB DATA to generate pre-processed digital image data P_RGB DATA. The shift register 122 which receives the pre-processed digital image data may generate digital signals DS1 to DSn therefrom.

Figure 13:
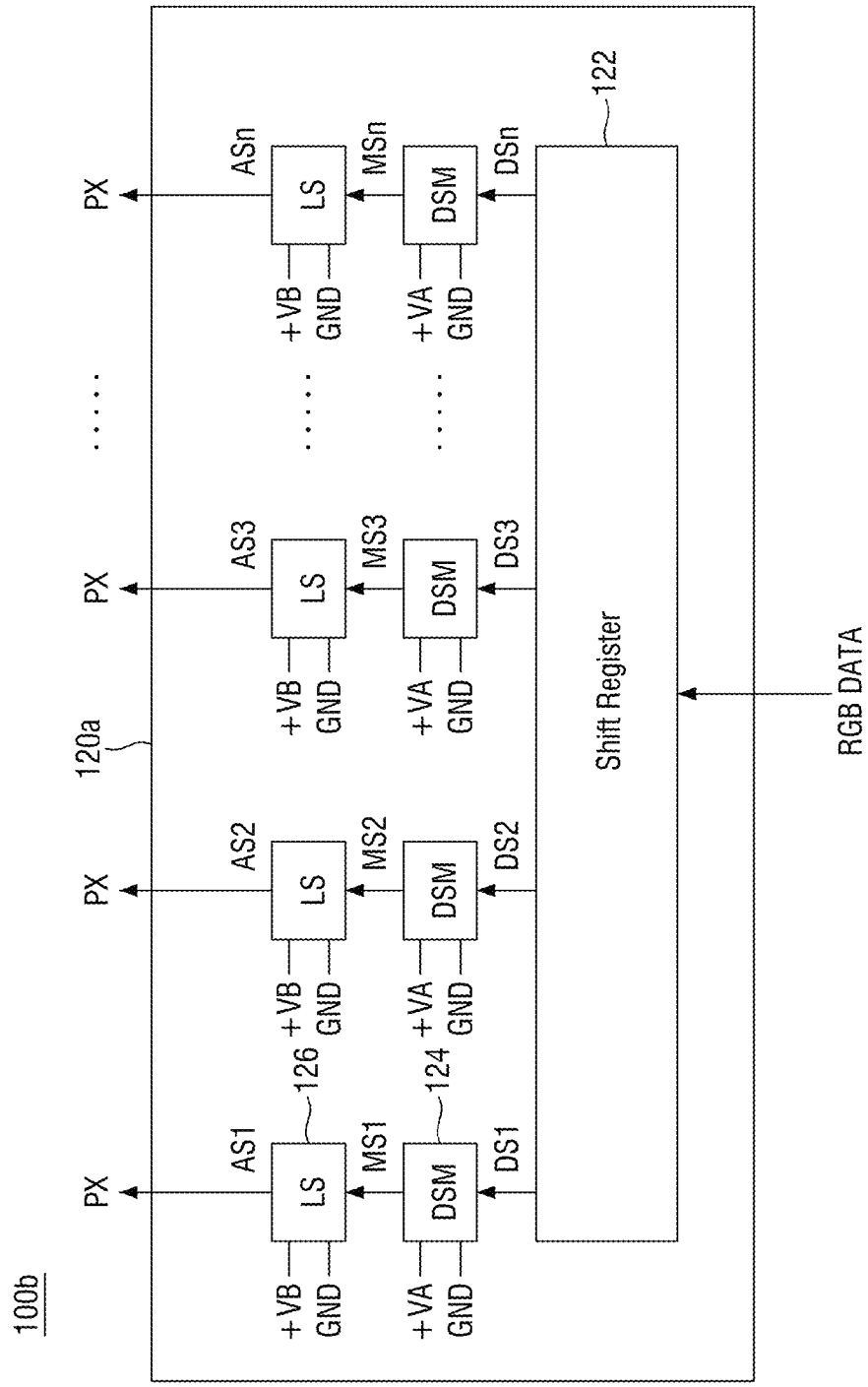
FIG. 13 is a block diagram of the display driver IC according to some example embodiments.

FIG. 13 is a block diagram of a display driver IC according to some example embodiments.

Hereinafter, repeated contents of the above-described example embodiments will not be explained, and the differences will be mainly explained.

Referring to FIG. 13, the display driver IC 100a is different from the display driver IC (100 of FIG. 6) described above in that the source driver 120a may not include the filter (128 of FIG. 6). That is, the filter (128 of FIG. 6) may be omitted in the display driver IC (100 of FIG. 6) described above.

That is, by using the metal resistance (load) of the organic light emitting diode (OLED) included in the pixel PX, and the capacitor included in the pixel PX, the filter (128 of FIG. 6) may be omitted in the display driver IC (100 of FIG. 6). Details thereof will be explained below.

Figure 14:
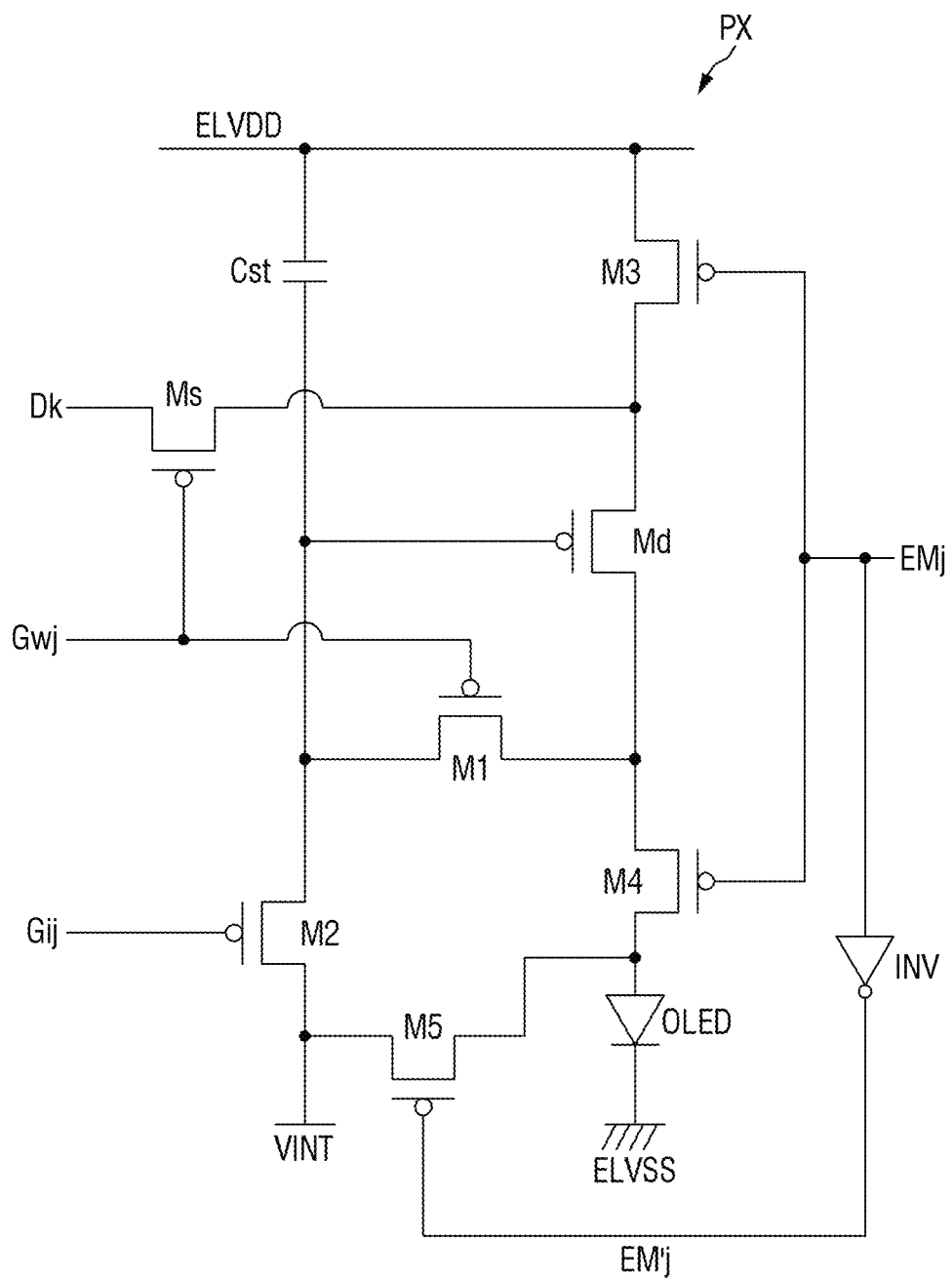
FIG. 14 is an example circuit diagram of the pixel shown in FIG. 4.
Figure 15:
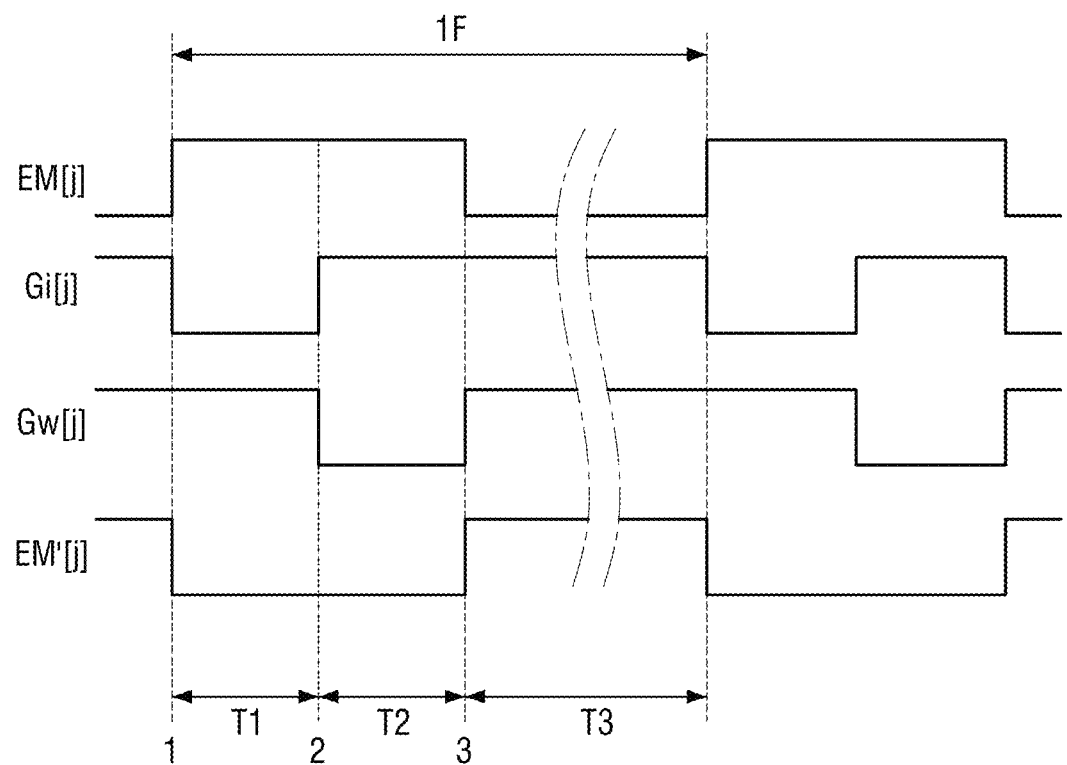
FIG. 15 is a timing diagram showing an operation of a pixel circuit shown in FIG. 14.
Figure 16:
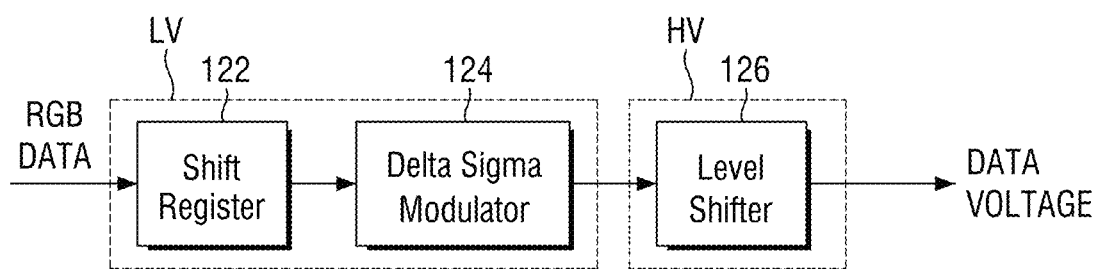

FIG. 14 is an example circuit diagram of the pixel shown in FIG. 14. FIG. 15 is a timing diagram showing an operation of the pixel circuit shown in FIG. 14. FIG. 16 is a diagram for explaining the effect of the display driver IC according to some example embodiments.

Referring to FIG. 14, the pixel PX is connected to a $j^{th}$ scan line Gij, a $j^{th}$ scan line Gwj, a $j^{th}$ light emitting control line EMj, and a $k^{th}$ data line Dk. Other pixels PX may also be formed in the same manner as the pixel shown in FIG. 14.

As shown in FIG. 14, the pixel PX may include a switching transistor Ms, a driving transistor Md, a compensation transistor M1, an initialization transistor M2, light emitting transistors M3 and M4, a bypass transistor M5, a storage capacitor Cst, an organic light emitting diode OLED and/or an inverter INV.

A driving voltage source for emitting light from the organic light emitting element OLED included in the pixel PX may be applied to the first voltage supply line ELVDD.

Although FIG. 14 shows the transistors Ms, Md and M1 to M5 as PMOS (p-channel metal oxide semiconductor) transistors, which are p-channel type transistors, the embodiments are not limited thereto, and other transistors that perform similar functions may be used in place of the PMOS transistor.

The switching transistor Ms may include a gate electrode connected to the scan line Gwj, a source electrode connected to the data line Dk, and/or a drain electrode connected to the source electrode of the driving transistor Md. The switching transistor Ms is turned on by the scan signal Gw[j] applied to the scan line Gwj, and may transfer the data voltage D [k], which is applied to the data line Dk, to the source electrode of the driving transistor Md.

The driving transistor Md may include a source electrode to which a data voltage is transferred during a period in which the switching transistor Ms is turned on, a gate electrode connected to a first end of the storage capacitor Cst, and/or a drain electrode connected to the source of the light emitting transistor M4.

The first end of the storage capacitor Cst is connected to the gate electrode of the driving transistor Md, and the second end may be connected to a voltage source that applies a voltage source ELVDD.

The compensation transistor M1 may include a gate electrode connected to the scan line Gwj, a drain electrode connected to the gate electrode of the driving transistor Md, and/or a source electrode connected to a drain electrode of the driving transistor Md.

The compensation transistor M1 may be turned on by a scan signal applied to the scan line Gwj to diode-connect the driving transistor Md.

The initialization transistor M2 may include a gate electrode connected to the scan line Gij, a drain electrode connected to a voltage source that supplies the initialization voltage VINT, and/or a source electrode connected to the gate of the driving transistor Md.

The light emitting transistor M3 may include a gate electrode connected to the light emitting control line EMj, a source electrode connected to a voltage source that supplies the voltage ELVDD, and/or a drain electrode connected to a source of the driving transistor Md.

The light emitting transistor M4 may include a gate electrode connected to the light emitting control line EMj, a source electrode connected to the drain electrode of the driving transistor Md, and/or a drain electrode connected to an anode electrode of the organic light emitting diode OLED.

The bypass transistor M5 may include a gate electrode connected to an output end of the inverter INV, a drain electrode connected to the voltage source that supplies the initialization voltage INV, and/or a source electrode connected to the anode electrode of the organic light emitting diode OLED.

The inverter INV may be connected between the gate electrodes of the light emitting transistor M3 and the light emitting transistor M4 and the bypass transistor M5. The inverter INV receives the input of the light emitting signal transferred through the light emitting control line EMj, inverts the light emitting signal, and may transmit the inverted light emitting signal to the gate electrode of the bypass transistor M5. The inverter INV may include a bipolar transistor, a field effect transistor, an insulated gate bipolar transistor, and the like.

The organic light emitting diode OLED may include an anode electrode connected to a source electrode of the bypass transistor M5, and/or a cathode electrode connected to a voltage source that supplies the voltage ELVSS. The organic light emitting diode OLED may emit light according to the current flowing through the driving transistor Md when the transistors M3 and M4 are turned on by the light emitting signal EM[j] transferred through the light emitting control line EMj, and may display a gray scale.

Referring to FIG. 15, FIG. 15 shows signals during a predetermined (or alternately given) period including one frame period 1F.

Referring to FIG. 15, a high-level light emitting signal is applied to the light emitting control line EMj at a time point 1 of the initialization period T1. Then, the transistors M3 and M4 are turned off and no current flows through the driving transistor Md.

Also, at the time point 1 of the initialization period T1, the inverter INV applies a low-level light emitting signal Em'[j] obtained by inverting a high-level light emitting signal Em[j] to a light emitting control line EM'j to turn on the bypass transistor M5. During the initialization period T1 and the scan period T2, when the driving transistor Md is turned off and the bypass transistor M5 is turned on, a bypass path to the bypass transistor M5 and the voltage source of the initialization voltage VINT is formed. Thus, the leakage current may leak through the bypass transistor M5 before the light emitting period T3.

In addition, a low-level scan signal Gi[j] is applied to a scan line Gij at the time point 1 of the initialization period T1. As a result, the initialization transistor M2 is turned on, the initialization voltage VINT is applied to the gate electrode of the driving transistor Md to initialize the gate electrode, and the storage capacitor Cst is initialized to (ELVDD-VINT) voltage.

Next, at a time point 2 of the scan period T2, the low-level scan signal Gw[j] is applied to the scan line Gwj. Then, the switching transistor Ms and the compensation transistor M1 are turned on. First, when the compensation transistor M1 is turned on, the drain of the driving transistor Md is connected to the gate of the driving transistor Md by the turned-on compensation transistor M1, and the driving transistor Md is diode-connected. Therefore, the voltage between the gate and source of the driving transistor Md becomes a threshold voltage of the driving transistor Md.

Further, when the switching transistor Ms is turned on, the data voltage D[k] is applied to the source electrode of the driving transistor Md from the data line Dk. If the data voltage D [k] is defined as Vdata and the threshold voltage of the driving transistor Md is defined as Vth (a negative voltage), the gate voltage of the driving transistor Md is Vdata+Vth.

The voltage applied to the gate electrode of the driving transistor Md is maintained by the storage capacitor Cst. That is, the output of the display driver IC (100b of FIG. 13) described above is stored and accumulated in the storage capacitor Cst included in the pixel PX.

Next, at a time point 3 of the light emitting period T3, the low-level light emitting signal EM[j] is applied to the light emitting control line EMj. Then, since the transistors M3 and M4 are turned on during the light emitting period T3, and the inverter INV inverts the low-level light emitting signal EM[j] and applies the high-level light emitting signal EM[j] to the light emitting control line EM'j, the bypass transistor M5 is turned off. If the driving transistor Md is turned on and the bypass transistor M5 is turned off during the light emitting period T3, the organic light emitting diode OLED emits light according to the data voltage D[k].

That is, there is a time difference between the time point at which the output of the display driver IC (100b of FIG. 13) described above is stored and accumulated in the storage capacitor Cst included in the pixel PX, and the time point at which the organic light emitting diode OLED actually emits light according to the data voltage D[k]. Therefore, when the organic light emitting diode OLED emits light, the influence of the current fluctuation charged in the storage capacitor Cst is not significant, and only the total amount of charges charged in the storage capacitor Cst is important. Therefore, the storage capacitor Cst included in the pixel PX can be used as a role of a filter (128 of FIG. 6) of the display driver IC (100 of FIG. 6).

In this way, when the storage capacitor Cst included in the pixel PX can be used as a role of the filter (28 of FIG. 6) of the display driver IC (100 of FIG. 6), as shown in FIG. 16, the number of high-voltage elements HV of the display driver IC 100b may further decrease. That is to say, the size of the display driver IC 100b may further decrease, and the power consumption due to the use of the filter may be reduced.

Figure 17:
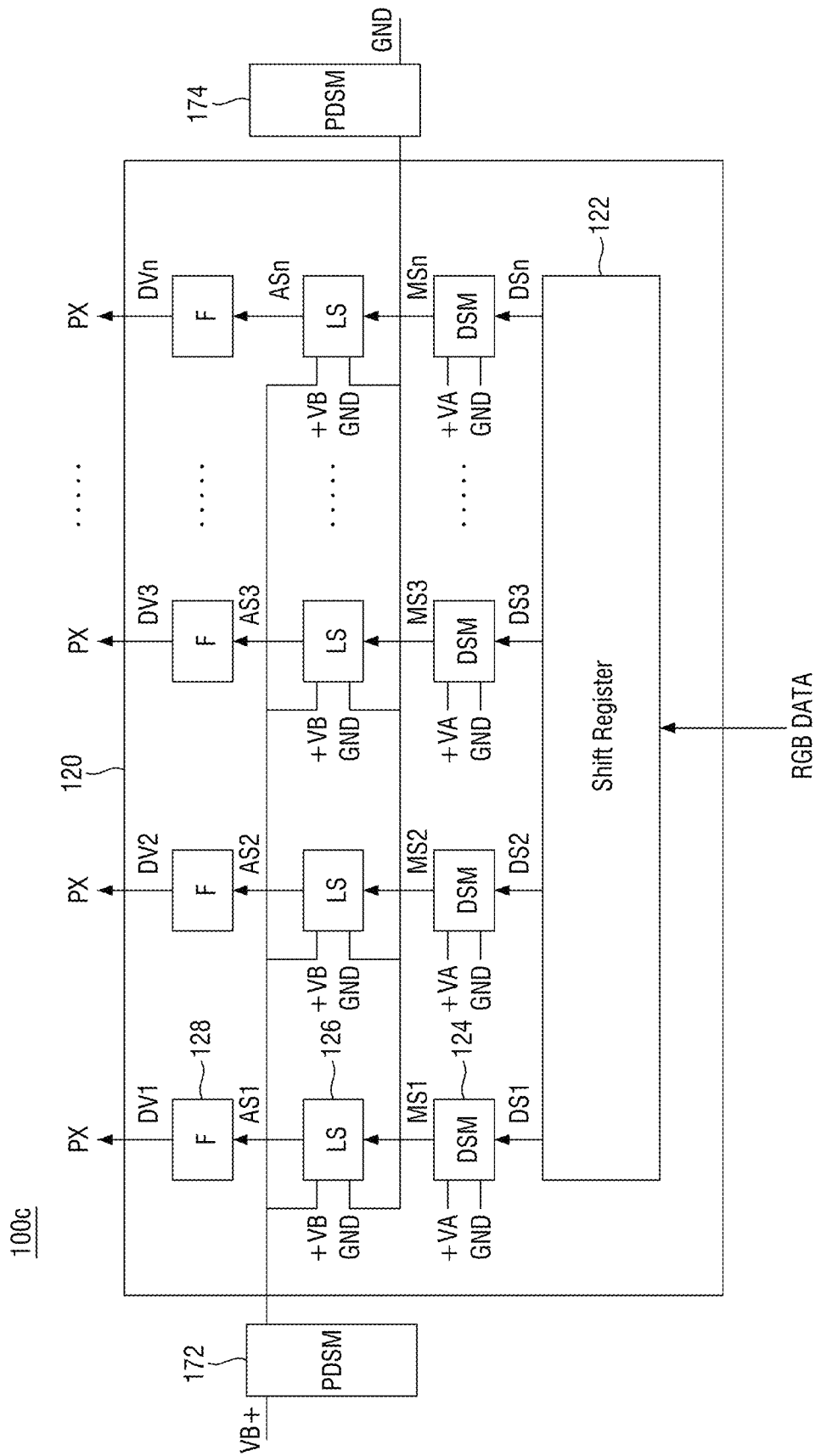
FIG. 17 is a block diagram of the display driver IC according to some example embodiments.

FIG. 17 is a block diagram of a display driver IC according to some example embodiments.

Hereinafter, repeated contents of the above-described example embodiments will not be explained, and the differences will be mainly explained.

Referring to FIG. 17, a display driver IC 100c may include a first power delta-sigma modulator 172 and a second power delta-sigma modulator 174.

In some example embodiments, the first power delta-sigma modulator 172 and the second power delta-sigma modulator 174 may be disposed outside the source driver 120.

The first power delta-sigma modulator 172 is disposed outside the source driver, receives provision of a second voltage VB provided to the display driver IC 100c from the outside, and may provide an output subjected to the delta-sigma modulation to each or one or more of the level shifters 126 of the source driver 120. As a result, each or one or more of the level shifters 126 of the source driver 120 may perform the amplification on the modulated signals MS1 to MSn, using the second voltage VB that is output from the first power delta-sigma modulator 172.

The second power delta-sigma modulator 174 is also disposed outside the source driver 120, receives provision of the ground voltage GND provided to the display driver IC 100c from the outside, and may provide the output subjected to the delta-sigma modulator to each or one or more of the level shifters 126 of the source driver 120. As a result, each or one or more of the level shifters 126 of the source driver 120 may perform the amplification on the modulated signals MS1 to MSn, using the ground voltage GND that is output from the second power delta-sigma modulator 174. Here, the ground voltage GND may be implemented by being converted into another voltage lower than the second voltage VB.

As the p-value described above that determines the resolution of the pixels PX is large, the data voltages DV1 to DVn are desired to be sophisticatedly generated, but the noise of the voltage provided to the level shifter 126 may act as a factor that hinders generation of sophisticated data voltages DV1 to DVn.

Therefore, in this example embodiment, by providing a noise-reduced voltage to the level shifter 126, using the first and second power delta-sigma modulators 172 and 174, it is possible to generate sophisticated data voltages DV1 to DVn.

Although various example embodiments of the display driver IC according to the present inventive concepts have been described above with reference to FIGS. 1 to 17, the embodiments according to the present inventive concepts are not limited to the shown examples. The components included in each example embodiment may be modified and implemented in any number of different combinations.

In concluding the detailed description, those skilled in the art will appreciate that many variations and modifications may be made to the example embodiments without substantially departing from the principles of the present inventive concepts. Therefore, the disclosed example embodiments of the inventive concepts are used in a generic and descriptive sense only and not for purposes of limitation.

What is claimed is:

1. A display driver integrated circuit (IC) comprising:
a shift register configured to output a digital signal; and
a digital-analog converter configured to receive the digital signal and generate a data voltage corresponding to the digital signal, wherein the digital-analog converter includes,
a delta-sigma modulator configured to output a modulated signal by,
receiving the digital signal and a first voltage, and
performing delta-sigma modulation on the digital signal using the first voltage, and
a level shifter configured to receive the modulated signal and a second voltage higher than the first voltage, and amplify the modulated signal using the second voltage,
wherein the delta-sigma modulator is a lower-voltage element than the level shifter.

2. The display driver IC of claim 1, wherein the digital-analog converter comprises:
a filter including a capacitor configured to store the output of the level shifter; and
a resistor.

3. The display driver IC of claim 1, wherein the level shifter comprises:
a first transistor having a first gate end configured to receive the modulated signal, and a first end configured to receive the second voltage; and
a second transistor having a second gate end configured to receive the modulated signal, a second end connected to the first end of the first transistor, and a third end configured to receive a third voltage lower than the second voltage.

4. The display driver IC of claim 3, wherein the third voltage is lower than the first voltage.

5. The display driver IC of claim 1, wherein the digital signal includes a first digital signal and a second digital signal, and the shift register is configured to sequentially output the first digital signal and the second digital signal,
wherein the delta-sigma modulator includes,
a first delta-sigma modulator configured to perform delta-sigma modulation on the first digital signal using the first voltage to output a first modulated signal, and
a second delta-sigma modulator, different from the first delta-sigma modulator, and configured to perform delta-sigma modulation on the second digital signal using the first voltage to output a second modulated signal, and wherein the level shifter includes,
a first level shifter configured to amplify the first modulated signal using the second voltage, and
a second level shifter, different from the first level shifter, and configured to amplify the second modulated signal using the second voltage,
wherein the first level shifter includes a first D-Class amplifier, and
the second level shifter includes a second D-Class amplifier.

6. The display driver IC of claim 5, further comprising:
a first power delta-sigma modulator configured to provide the second voltage to the first D-Class amplifier and the second D-Class amplifier; and
a second power delta-sigma modulator configured to provide a third voltage lower than the second voltage to the first D-Class amplifier and the second D-Class amplifier.

7. The display driver IC of claim 6, wherein the first power delta- sigma modulator and the second power delta-sigma modulator are outside a source driver.

8. The display driver IC of claim 1, further comprising:
a pre-processor configured to,
receive digital image data,
perform digital gamma processing on the digital image data, and
output the processed digital image data to the shift register.

9. A display device comprising:
a display panel including pixels; and
a display driver integrated circuit (IC) including a delta-sigma modulator and a level shifter, the display driver IC configured to,
generate a data voltage to cause the pixels to display a gray scale by,
receiving digital image data,
performing, via the delta-sigma modulator, delta-sigma modulation on the digital image data using a first voltage, and
amplifying, via the level shifter, the modulated signal using a second voltage higher than the first voltage to generate the data voltage, and provide the data voltage to the display panel.

10. The display device of claim 9, wherein the display driver IC comprises:
a shift register configured to output a digital signal based on the digital image data; and
a filter,
wherein the delta-sigma modulator is configured to output a modulated signal by performing delta-sigma modulation on the digital signal using the first voltage,
wherein the level shifter is configured to amplify the modulated signal using the second voltage, and
wherein the filter is configured to store the output of the level shifter to generate the data voltage.

11. The display device of claim 10, wherein the pixels include a first pixel and a second pixel different from each other,
the digital signal includes,
a first digital signal corresponding to the first pixel, and
a second digital signal corresponding to the second pixel, the delta-sigma modulator includes,
a first delta-sigma modulator configured to output a first modulated signal by performing delta-sigma modulation on the first digital signal using the first voltage, and
a second delta-sigma modulator configured to output a second modulated signal by performing delta-sigma modulation on the second digital signal using the first voltage,
the level shifter includes,
a first level shifter configured to amplify the first modulated signal using the second voltage, and
a second level shifter configured to amplify the second modulated signal using the second voltage, and
the filter includes,
a first filter configured to store an output of the first level shifter and generate a first data voltage to cause the first pixel to display a first gray scale, and
a second filter configured to store an output of the second level shifter and generate a second data voltage to cause the second pixel to display a second gray scale.

12. The display device of claim 11, wherein the display driver IC comprises:
a first power delta-sigma modulator configured to provide the second voltage to the first level shifter and the second level shifter, and
a second power delta-sigma modulator configured to provide a third voltage lower than the second voltage to the first level shifter and the second level shifter.

13. The display device of claim 12, wherein the first level shifter includes a first D-Class amplifier and the second level shifter includes a second D-Class amplifier.

14. The display device of claim 13, wherein the third voltage is lower than the first voltage.

15. The display device of claim 10, wherein the display driver IC comprises:
a pre-processor configured to,
perform a digital gamma process on the digital image data, and
provide the digital image data to the shift register.

16. The display device of claim 9, wherein the display driver IC comprises:
a shift register configured to,
receive the digital image data, and
output a digital signal based on the digital image data,
wherein the delta-sigma modulator is configured to output a modulated signal by performing delta-sigma modulation on the digital signal using a first voltage,
wherein the level shifter is configured to amplify the modulated signal using a second voltage higher than the first voltage, and
wherein the pixels include a capacitor configured to,
store an output of the display driver IC, and
generate the data voltage.

17. An electronic device comprising:
a host configured to output digital image data;

a display panel including pixels; and a display driver integrated circuit (IC) including a delta-sigma modulator and a level shifter, the display driver IC configured to generate a data voltage to cause the pixels to display a gray scale corresponding to the digital image data by, performing, via the delta-sigma modulator, delta-sigma modulation on the digital image data using a first voltage, and amplifying, via the level shifter, the modulated signal using a second voltage higher than the first voltage, wherein the delta-sigma modulator is a lower-voltage element than the level shifter.

18. The electronic device of claim 17, wherein the display driver IC comprises:

a shift register configured to output a digital signal based on the digital image data, wherein the delta-sigma modulator is configured to output a modulated signal by performing delta-sigma modulation on the digital signal using the first voltage; and wherein the level shifter is configured to amplify the modulated signal using the second voltage.

19. The electronic device of claim 18, wherein the host includes an application processor (AP), and the AP and the display driver IC are mounted on a flexible PCB substrate on a back side of the display panel.

20. The electronic device of claim 18, wherein the display driver IC comprises:

a filter configured to, store the output of the level shifter through a capacitor, and generate the data voltage.

* * * * *